United States Patent [19]

West et al.

[11] Patent Number: 4,663,275

[45] Date of Patent: May 5, 1987

[54] PHOTOLITHOGRAPHIC METHOD AND COMBINATION INCLUDING BARRIER LAYER

[75] Inventors: Paul R. West, Malta; Gary C. Davis, Albany, both of N.Y.

[73] Assignee: General Electric Company, Schenectady, N.Y.

[21] Appl. No.: 647,295

[22] Filed: Sep. 4, 1984

[51] Int. Cl.$^4$ .................. G03C 1/495; G03C 1/727
[52] U.S. Cl. ................... 430/271; 430/311;
430/333; 430/334; 430/339; 430/273; 430/156;
430/325; 430/326; 430/327
[58] Field of Search ............ 430/311, 333, 334, 339,
430/273, 156, 325, 326, 327, 271

[56] References Cited

U.S. PATENT DOCUMENTS

| | | | |
|---|---|---|---|
| 3,567,445 | 3/1971 | Atkinson et al. | 430/156 |
| 3,652,273 | 3/1972 | Htoo | 430/273 |
| 3,965,278 | 6/1976 | Duinker et al. | 96/36.1 X |

FOREIGN PATENT DOCUMENTS 110165 10/1983 European Pat. Off. .

Primary Examiner—John E. Kittle
Assistant Examiner—Cynthia Hamilton
Attorney, Agent, or Firm—William H. Pittman; James C. Davis, Jr.; James Magee, Jr.

[57] ABSTRACT

Photolithographic methods employing a photoresist layer and a contrast enhancing photobleachable layer deposited thereon have certain disadvantages including compatibility and the tendency toward scum formation during stripping of the photobleachable layer. These problems are alleviated by the deposition of an aqueous alkali-soluble polymeric barrier layer such as poly(vinyl alcohol), which is removed simultaneously with the alkaline development step for the photoresist. In a preferred embodiment, the polymeric binder for the photobleachable layer is also water-soluble and is also removed simultaneously with development.

23 Claims, 5 Drawing Figures

PHOTOLITHOGRAPHIC METHOD AND COMBINATION INCLUDING BARRIER LAYER

This invention relates to photolithography processes and combinations for use therein.

The use of photolithographic techniques in the manufacture of integrated circuits is well known. In such photolithographic techniques, a photoresist layer is deposited on a substrate to be etched. The photoresist is masked and exposed to a source of light of predetermined wavelength to induce a photoinitiated reaction resulting in the formation of compounds removable by development, typically carboxylic acids. Development is then effected by contact with an aqueous alkaline solution, which dissolves said compounds to expose the desired layers of the substrate for dry or wet etching.

Increasing miniaturization of integrated circuits has necessitated the development of photolithographic techniques of very high resolution capability. One such technique is the use of a contrast enhancing layer on the photoresist. As disclosed in European patent application No. 110,165 and in copending, commonly assigned application Ser. No. 536,923, filed Sept. 28, 1983, the disclosures of which are incorporated by reference herein, the contrast enhancing layer is a photobleachable layer containing a polymeric binder in combination with a photobleachable compound, typically an aryl nitrone. The photobleachable layer may be deposited on the photoresist by dissolving the same in a suitable solvent, applying it by a technique such as spin-coating and evaporating the solvent. The photoresist is then conventionally masked and exposed, said exposure also causing bleaching of the photobleachable layer. Said layer is then stripped by means of a suitable solvent and the photoresist is conventionally developed.

Successful and economical use of a photobleachable layer in this manner imposes a number of requirements. In the first place, the photobleachable layer and the solvent used for its application must be compatible with the photoresist. This is often difficult to achieve, since a number of solvents for polymeric binders and photobleachable compounds attack novolacs and similar photoresist materials. Moreover, it is sometimes found that photobleachable compounds migrate into the photoresist surface upon application of the photobleachable layer. As a consequence of these conditions, an interface may form which is not completely removed during development. The resulting debris or scum may migrate to clear areas of the photoresist and interfere with its development. It may also settle on substrate areas, interfering with etching and/or with the formation of electrical contacts after etching has been completed. This problem is particularly severe when immersion or puddle development is employed, as contrasted with spray development which is more effective to remove such debris.

These problems are alleviated to some extent in accordance with the aforementioned application by depositing a barrier layer, referred to therein as "a thin conformal layer of neutral material formed in situ", between the photoresist and photobleachable layers. For example, a barrier layer of poly-α-methylstyrene may be deposited on a novolac photoresist, followed by a photobleachable layer in which the binder is poly(-vinylpyrrolidone). In this instance, such common solvents as alcohols may be used to remove the photobleachable layer but do not contact the photoresist, toward which they are very aggressive, because of the presence of the barrier layer. Under these conditions, however, several additional process steps are required. In addition to the photobleachable layer stripping step, it is often necessary to rinse the barrier layer with water. A second solvent must then be applied to remove the barrier layer before development of the photoresist can take place.

A principal object of the present invention, therefore, is to provide improved photolithographic methods employing a photobleachable layer deposited on a barrier layer.

A further object is to provide methods which protects the photoresist from attack prior to development with a minimum of added process steps.

A still further object is to provide novel photolithographic combinations useful in increasing the effectiveness and efficiency of photoresist-based processes.

Other objects will in part be obvious and will in part appear hereinafter.

Figure 1:
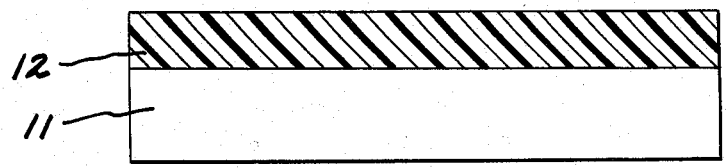
FIG. 1 THROUGH FIG. 5 are illustrative of the stages of the photolithographic processes of the invention.

The present invention is based on the discovery of several aqueous alkali-soluble, optically transparent polymer materials which may be used as barrier layers to separate the photoresist from the photobleachable layer. Being alkali-soluble, these materials may be removed in the step of alkaline development of the photoresist.

In one of its aspects, the present invention is directed to a photolithographic method which comprises the steps of:

(A) depositing a photoresist layer on a substrate to be etched;

(B) depositing an aqueous alkali-soluble, optically transparent polymeric barrier layer on said photoresist layer;

(C) depositing on said barrier layer a photobleachable layer comprising a polymeric binder and at least one photobleachable compound;

(D) masking said layers and exposing them to light of a predetermined wavelength to which said photoresist layer and photobleachable compound are sensitive;

(E) stripping said photobleachable layer; and (F) simultaneously developing said photoresist and stripping said barrier layer by contacting the same with an aqueous alkaline solution.

Step A in the method of this invention is the deposition of a photoresist layer on a substrate to be etched. Both the substrate and the photoresist are conventional and their natures are not a critical aspect of the invention. Typical substrates which may be etched include conductive or semiconductive materials such as aluminum, titanium, molybdenum, silicon, polysilicon, gallium arsenide and germanium; inorganic dielectric materials such as silicon dioxide, silicon nitride, silicon oxynitride and mixtures thereof; and organic dielectrics such as polyimides and polysiloxane polyimides.

The photoresist layer is typically a novolac or poly(-vinylphenol) resin having a thickness of about 1-2 microns and containing a material capable of photoinitiated degradation such as a diazonaphthoquinone ester. The photoresist layer may be deposited on the substrate by conventional methods such as dissolution in a suitable solvent, spin-coating and baking to evaporate the solvent.

In step B, a polymeric barrier layer is deposited on said photoresist layer. The polymer therein should be transparent to the light used to expose the photoresist and soluble in aqueous alkali to enable its removal by the alkaline developing solution. For obvious reasons, it should also preferably be soluble in a medium which is non-aggressive to the photoresist layer to enable its deposition thereon, and substantially resistant to the solvent used to deposit the photobleachable layer.

The preferred polymers for use as the barrier layer are water-soluble polymers, of which poly(vinyl alcohol), poly(acrylic acid), poly(methacrylic acid), poly(vinylpyrrolidone), poly(ethylene oxide) and mixtures thereof are illustrative. Deposition of such polymers on the photoresist layer may be by spin-coating from an aqueous solution, followed by baking to remove water, or by other conventional techniques. Under these conditions, said photoresist layer is inert to the barrier layer system.

The thickness of the barrier layer and the molecular weight of the polymer therein should be adequate to protect the photoresist layer against attack. In general, thicknesses of about 300–2500 Angstroms (0.03–0.25 micron) are adequate for this purpose. A thickness greater than 5000 Angstroms ordinarily serves no useful purpose and may cause focusing problems and render the barrier layer difficult to remove completely during the development step. Molecular weights (weight average whenever referred to herein) are generally in the range of about 2000–12,000 and seldom higher than about 100,000, since above that level solubility in aqueous alkali may decrease, making rapid development difficult or impossible.

In step C, the photobleachable layer is deposited on the barrier layer. In its most general sense, the photobleachable layer and the method for its deposition are disclosed in the aforementioned European patent application No. 110,165, and the details need not be repeated here. Suitable polymeric binders include vinyl acetate polymers, styrene copolymers, alkyl acrylate or methacrylate polymers, acetal resins, acrylonitrile-butadiene copolymers, hydrocarbon-soluble cellulose ethers and esters, chloroprene polymers, poly(ethylene oxide) and poly(vinylpyrrolidone). Suitable solvents include aliphatic, aromatic or alicyclic hydrocarbons, chlorinated derivatives thereof and alcohols. Illustrative photobleachable compounds are the aryl nitrones. The thickness of the photobleachable layer is usually about 0.1–1.0 micron.

In a preferred embodiment of the invention, the binder in the photobleachable layer is also soluble in aqueous alkali. The only condition for such alkali-soluble binders is that they also be soluble in a liquid other than water which does not attack the barrier layer, so that they may be coated thereon. An illustrative polymer is poly(vinylpyrrolidone), which may be dissolved in such organic liquids as the aforementioned 1-butanol and 1,1,2-trichloroethane.

Step D is the conventional masking-exposure step utilized with photoresists. As described in the aforementioned European patent application, it utilizes light which simultaneously bleached the photobleachable compound (in the case of an aryl nitrone, by converting it to the corresponding oxaziridine) and initiates a photodegradation reaction in the photoresist. Typically, such light has a wavelength in the range of 200–450 nanometers.

When exposure is complete, the photobleachable layer is stripped in step E. As previously explained, stripping may be effected prior to photoresist development by contacting the photobleachable layer with a suitable organic solvent. Illustrative solvents of this type are toluene, xylene and trichloroethylene. In the preferred embodiment of the invention, however, the binder in the photobleachable layer is alkali-soluble and step E is accomplished simultaneously with step F.

In step F, an aqueous alkali solution is used to develop the photoresist, simultaneously stripping the barrier layer and, preferably, also the photobleachable layer. The alkali solution may be, for example, a sodium hydroxide, potassium hydroxide or tetraalkylammonium hydroxide solution having a concentration of about 0.1–1.0 M and especially about 0.2–0.5 M. The temperature of the development step is ordinarily about 20°–50° C. and usually about 25°–30° C.

The development and stripping steps may be effected by conventional operations such as spraying, immersion or puddling. The method of this invention is particularly effective to suppress scum deposition during development by immersion or puddling.

The product of the method of this invention is a substrate containing a positive photoresist thereon with lines and spaces of high resolution at dimensions as small as 0.5 micron. Said substrate may be patterned by conventional dry or wet etching operations. The invention is particularly useful with wet etching, since the formation of scum which interferes with etching can be inhibited by simultaneous alkaline development and stripping of the photobleachable layer.

Figure 2:
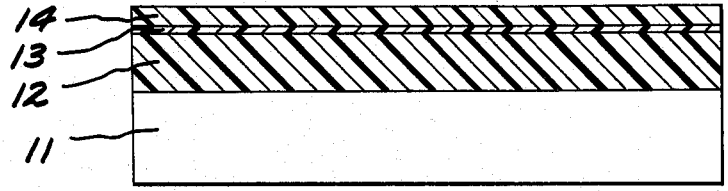
Figure 3:
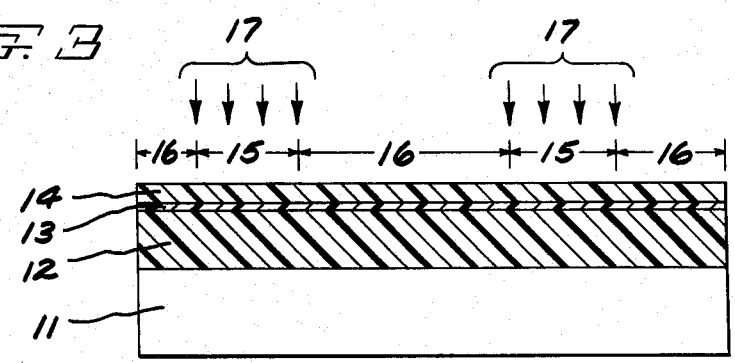

Reference is now made to the drawings, which represent several stages of the method of this invention. FIG. 1 shows an object comprising substrate 11 and photoresist layer 12 deposited thereon. FIG. 2 shows said object further containing relatively thin barrier layer 13 and photobleachable layer 14 deposited thereon. In FIG. 3, the surface of the resultant structure is shown being exposed to a pattern of radiation 17 to produce illuminated regions 15 and non-illuminated (masked) regions 16, for a time to produce a contrast-enhanced image in the range of dosages to which photoresist layer 14 is sensitive and which fully expose said layer.

Figure 4:
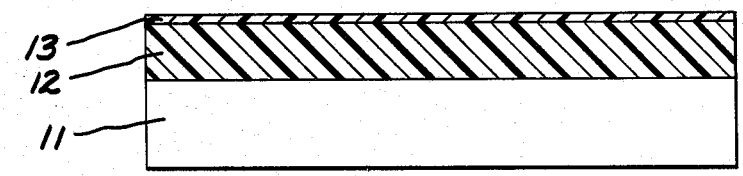
Figure 5:
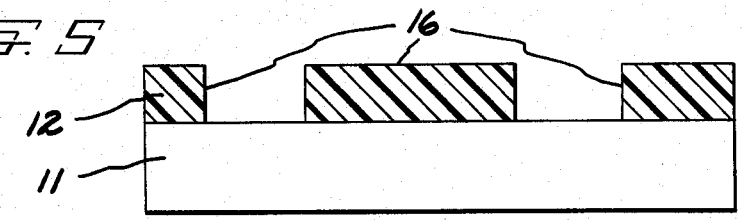

Thereafter, photobleachable layer 14 may be removed by using a suitable stripping solvent which does not affect barrier layer 13 or photoresist layer 12, as shown in FIG. 4, after which the exposed portions of the photoresist are removed by development, leaving remaining portions 16 which are unexposed or insufficiently exposed as shown in FIG. 5. Preferably, however, barrier and photobleachable layers 13 and 14, respectively, are removed simultaneously with development of photoresist layer 12. In this embodiment, FIG. 4 is bypassed and the process moves directly from FIG. 3 to FIG. 5.

Another aspect of the present invention is the photolithographic combination comprising a substrate to be etched, a photoresist layer deposited thereon, a barrier layer deposited on said photoresist layer, and a photobleachable layer deposited on said barrier layer. Each of said layers is more fully described hereinabove, as are the methods for their deposition.

The invention is illustrated by the following examples. All percentages are by weight.

EXAMPLE 1

A silicon wafer was spin-coated with a conventional novolac photoresist to produce a photoresist layer about 1.4 microns thick. A poly(vinyl alcohol) barrier layer was deposited thereon by spin-coating with a 5% aqueous solution of poly(vinyl alcohol) having a weight average molecular weight of about 10,000, to produce a coating approximately 1300 Angstroms thick. A photobleachable layer 0.4 micron thick was then applied by spin-coating with a solution in ethylbenzene of 8% each of α-diethylaminophenyl-N-phenylnitrone and a styrene-allyl alcohol copolymer having a molecular weight of about 1600 and a hydroxyl content of about 5.4–6.0%.

A dark-field mask was applied and the wafer was exposed. Following exposure, the photobleachable layer was removed by immersion in xylene for 45 seconds and the photoresist was spray developed for 20 seconds, using an approximately 0.2 M aqueous sodium hydroxide solution. The development produced a sharp, clean pattern of lines and spaces in the 1-micron range on the silicon substrate. By contrast, similar treatment of a control wafer without the presence of a barrier layer produced, after development for 15 seconds, a pattern with numerous traces of residual debris deposited during the xylene stripping step.

EXAMPLE 2

Three wafers were coated with photoresist, barrier and photobleachable layers as in Example 1, using as the barrier layer a poly(vinyl alcohol) having a molecular weight of about 3000 and being produced by hydrolysis of 75% of the acetate groups in a vinyl acetate polymer. The thicknesses of the barrier layers were 280, 440 and 1000 Angstroms, respectively. After removal of the photobleachable layer by puddle stripping and immersion development of the photoresist, the wafers having barrier layers of 440 and 1000 Angstroms showed no scum formation. Some scum was noted on the wafer with the 280-Angstrom barrier layer.

EXAMPLE 3

A polyimide-coated silicon substrate was spincoated with a photoresist layer and a poly(vinyl alcohol) barrier layer similar to those in Example 1. A photobleachable layer was then deposited on the barrier layer by spin-coating of a solution in 1-butanol of 8% each of α-diethylaminophenyl-N-phenylnitrone and a poly(vinylpyrrolidone) having a molecular weight of about 10,000. A mask was applied and the wafer was exposed as in Example 1, after which alkaline development for 20 seconds simultaneously removed the photobleachable and barrier layers. The resulting pattern showed clean lines and spaces in the 0.5-micron range.

What is claimed is:

1. A photolithographic method which comprises the steps of:
   (A) depositing a photoresist layer on an etchable substrate;
   (B) depositing an aqueous alkali-soluble, optically transparent polymeric barrier layer on said photoresist layer from a solvent which is non-aggressive to said photoresist layer;
   (C) depositing on said barrier layer a photobleachable layer comprising a polymeric binder and at least one photobleachable compound from a solvent which is non-aggressive to said barrier layer;
   (D) masking said layers and exposing them to light of a predetermined wavelength to which said photoresist layer and photobleachable compound are sensitive;
   (E) stripping said photobleachable layer; and
   (F) simultaneously developing said photoresist and stripping said barrier layer by contacting the same with an aqueous alkaline solution.

2. A method according to claim 1 wherein the barrier layer polymer is a water-soluble polymer which is substantially resistant to any solvent used to deposit said photobleachable layer, and is applied from an aqueous solution.

3. A method according to claim 2 wherein the barrier layer polymer is at least one of poly(vinyl alcohol), poly(acrylic acid), poly(methacrylic acid), poly-(vinylpyrrolidone) and poly(ethylene oxide) and has a weight average molecular weight in the range of about 2000–12,000.

4. A method according to claim 3 wherein step E is effected prior to step F by contacting said photobleachable layer with an organic solvent.

5. A method according to claim 4 wherein the thickness of the barrier layer is about 300–2500 Angstroms.

6. A method according to claim 5 wherein the binder in the photobleachable layer is a styrene-allyl alcohol copolymer.

7. A method according to claim 6 wherein the solvent used in step E is toluene, xylene or trichloroethylene.

8. A method according to claim 7 wherein the barrier layer polymer is poly(vinyl alcohol).

9. A method according to claim 3 wherein the binder in the photobleachable layer is also aqueous alkali-soluble and steps E and F are accomplished simultaneously.

10. A method according to claim 9 wherein the binder in the photobleachable layer is poly(vinylpyrrolidone).

11. A method according to claim 10 wherein the barrier layer polymer is poly(vinyl alcohol).

12. A photolithographic combination comprising a etchable substrate; a positive-working photoresist layer deposited thereon; an aqueous alkali-soluble, optically transparent polymeric barrier layer on said photoresist layer; and a photobleachable layer comprising a polymeric binder and at least one photobleachable compound deposited on said barrier layer.

13. A combination according to claim 12 wherein the barrier layer polymer is a water-soluble polymer which is also soluble in a medium which is non-aggressive to said photoresist layer and substantially resistant to any solvent used to deposit said photobleachable layer.

14. A combination according to claim 13 wherein the barrier layer polymer is at least one of poly(vinyl alcohol), poly(acrylic acid), poly(methacrylic acid), poly(vinylpyrrolidone) and poly(ethylene oxide) and has a weight average molecular weight in the range of about 2000–12,000.

15. A combination according to claim 14 wherein the photoresist layer comprises a novolak or poly(vinylphenol) resin containing a material capable of photoinitiated degradation.

16. A combination according to claim 15 wherein the thickness of the barrier layer is about 300–2500 Angstroms.

17. A combination according to claim 16 wherein the binder in the photobleachable layer is a styrene-allyl alcohol copolymer.

18. A combination according to claim 17 wherein the barrier layer polymer is poly(vinyl alcohol).

19. A combination according to claim 14 wherein the binder in the photobleachable layer is also alkalisoluble 20. A combination according to claim 19 wherein the photoresist layer comprises a novolak or poly(vinylphenol) resin containing a material capable of photoinitiated degradation.

21. A combination according to claim 20 wherein the thickness of the barrier layer is about 300–2500 Angstroms.

22. A combination according to claim 21 wherein the binder in the photobleachable layer is poly(vinylpyrrolidone).

23. A combination according to claim 22 wherein the barrier layer polymer is poly(vinyl alcohol).

* * * * *